US 8,283,184 B2

(12) United States Patent
Rührig

(10) Patent No.: US 8,283,184 B2
(45) Date of Patent: Oct. 9, 2012

(54) METHOD FOR MEASUREMENT OF VERY SMALL LOCAL MAGNETIC FIELDS, IN PARTICULAR FOR MEASUREMENT OF LOCAL MAGNETIC STRAY FIELDS PRODUCED BY MAGNETIC BEADS, AND AN ASSOCIATED DEVICE FOR CARRYING OUT THE METHOD

(75) Inventor: Manfred Rührig, Eckental (DE)

(73) Assignee: Siemens Aktiengesellschaft, Munich (DE)

( * ) Notice: Subject to any disclaimer, the term of this patent is extended or adjusted under 35 U.S.C. 154(b) by 1183 days.

(21) Appl. No.: 11/523,535

(22) Filed: Sep. 20, 2006

(65) Prior Publication Data
US 2007/0063695 A1 Mar. 22, 2007

(30) Foreign Application Priority Data
Sep. 21, 2005 (DE) .......................... 10 2005 045 094

(51) Int. Cl.
*G01N 33/553* (2006.01)
(52) U.S. Cl. ....... 436/526; 436/149; 436/518; 422/68.1; 422/82.01; 422/82.02; 977/932; 977/933; 977/934; 977/935; 324/200; 324/204; 324/207.21; 324/244; 324/252
(58) Field of Classification Search ................ 422/68.1, 422/82.02, 82.01; 436/149, 518, 526; 435/6; 977/932, 933, 934, 935; 324/200, 204, 207.21, 324/244, 252
See application file for complete search history.

(56) References Cited

U.S. PATENT DOCUMENTS
6,875,621 B2 * 4/2005 Tondra .......................... 436/518
2005/0087000 A1 4/2005 Coehoorn et al.
2005/0127916 A1 6/2005 Tondra FOREIGN PATENT DOCUMENTS
DE 196 49 265 A1 4/1998
DE 19649265 A1 * 6/1998
WO WO 03054523 A2 * 7/2003
WO WO 2005/010543 A1 3/2005

OTHER PUBLICATIONS
Rife et al, "Design and performance of GMR sensors for the detection of magnetic microbeads in biosensors" Sensors and Actuators A, Nov. 1, 2003, vol. 107, Issue 3, pp. 209-218.*

* cited by examiner

*Primary Examiner* — Dennis M White
(74) *Attorney, Agent, or Firm* — Harness, Dickey & Pierce, P.L.C.

(57) ABSTRACT

In a method for measurement of very small local magnetic fields, in particular of local magnetic stray fields produced by magnetic beads, at least one magnetoresistive element is used. The element includes a hard-magnetic reference layer and a soft-magnetic sensor layer, whose magnetization can be rotated to a parallel position or an antiparallel position with respect to the reference layer magnetization, and whose output signal which can be tapped off is dependent on the position of the sensor layer magnetization with respect to the reference layer magnetization. In this case, the magnetization of the sensor layer is saturated by way of an external saturation magnetic field in a direction at right angles to the reference layer magnetization, after which the magnetic field is switched off or reduced to such an extent that the magnetization of the sensor layer passes through a critical point as it comes out of saturation, at which critical point the rotation direction of the sensor layer magnetization can be influenced via an existing local magnetic field that is to be measured. Magnetoresistive elements are provided in the associated device and, in particular, are connected to form a bridge.

16 Claims, 3 Drawing Sheets

METHOD FOR MEASUREMENT OF VERY SMALL LOCAL MAGNETIC FIELDS, IN PARTICULAR FOR MEASUREMENT OF LOCAL MAGNETIC STRAY FIELDS PRODUCED BY MAGNETIC BEADS, AND AN ASSOCIATED DEVICE FOR CARRYING OUT THE METHOD

The present application hereby claims priority under 35 U.S.C. §119 on German patent application number DE 10 2005 045 094.6 filed Sep. 21, 2005, the entire contents of which is hereby incorporated herein by reference.

FIELD

The invention generally relates to a method for measurement of very small local magnetic fields. In particular, it relates to one for measurement of local magnetic stray fields produced by magnetic beads. In addition, the invention also generally relates to an associated device for carrying out the method.

BACKGROUND

It is very difficult to measure small local magnetic fields, on the one hand because the magnetic field strength to be measured is very small, while on the other hand fields such as these also frequently decay very quickly. If the fields are produced by very small particles, they in consequence cause only a negligibly small signal on a flat sensor whose area is typically very much larger than the particle diameter.

Magnetic fields with a very low field strength are produced, for example, by magnetic beads (beads=small balls)—referred to in the following text as magnetic beads—which are used in particular in the course of biotechnological DNA investigations. In the case of DNA investigations, biological receptacles, that is to say in particular cells, the DNA, must first of all be isolated and must be multiplied before analysis, which is carried out by way of a PCR (PCR=Polymerase Chain Reaction). During this process, the magnetic beads can be used to bind the isolated DNA.

DNA isolation is frequently used in nucleic acid analysis, for example of white blood cells from full blood, in order to answer, for example, human-genome questions. For this purpose, the cells must first of all be broken open (so-called lysis) in a sample preparation step, in order to isolate the released DNA in the above sense. Blood components such as hemoglobin, immunoglobulins and lactoferrin, which can inhibit the subsequent PCR, must be removed during this process.

In the laboratory, the cells are normally unlocked using an alkaline solution (NaOH), and the DNA is then bound to the magnetic beads, which are coated with silica. A DNA string thus adheres to the silicon layer on the magnetic bead, and is fixed in this way. The magnetic beads themselves can then be isolated, as is known by way of example from German patent application DE 10 2004 050 575 A1, from the same applicant, which was not published prior to this.

In addition to the joint isolation of a large number of magnetic beads by way of a magnetic field which is applied externally to the suspension containing the magnetic beads, it is also possible to use a DNA sensor to trap a magnetic bead to which a DNA string is bound, on which DNA sensor a complementary DNA string is arranged, which combines with the DNA string on the bead side. However, this is the case only when the sequences of the heterocylic nuclear bases of both strings correspond to one another, so that recombination can occur. A large number of individual DNA strings are, of course, provided in a distributed form over the sensor area on a DNA sensor such as this so that magnetic beads with DNA can be trapped at a large number of catchment points distributed over the sensor area.

One problem in this case is to detect whether there is or is not a magnetic bead now at a catchment point. As mentioned in the introduction, a magnetic bead represents a magnetic particle which produces an extremely small magnetic field so that—seen over the area—the detectable field inhomogeneity is extremely low, and the difficulties mentioned initially of locally resolved magnetic field measurement occur.

US 2005/0 127 916 A1 discloses a method for measurement of local magnetic fields, in which GMR measurement elements are used, in particular, as sensors. GMR measurement elements such as these are described in detail, for example, in DE 196 49 265 A1, in which, in particular, a double-layer system forms a reference layer and a reference layer composed of soft-magnetic material is present. Furthermore, WO 2005/010 543 A1 discloses a magnetic measurement device which is intended to be particularly suitable for detection of magnetic nanoparticles. In this case, suitable devices/methods are used to prevent crosstalk between the signals from the sensor and those from the magnetic-field generator. Finally, US 2005/087 000 A1 discloses a sensor such as this which, in particular, is intended to be suitable for DNA analysis by way of magnetic beads.

SUMMARY

A method is specified, in at least one embodiment, which allows the detection of even very small local magnetic fields so that, in particular, stray fields produced by magnetic beads can be detected, and the magnetic beads can thus be located.

At least one embodiment of the invention provides that at least one magnetoresistive element is used, comprising a hard-magnetic reference layer and a soft-magnetic sensor layer, whose magnetization can be rotated to a parallel position or an antiparallel position with respect to the reference layer magnetization, whose output signal which can be tapped off is dependent on the position of the sensor layer magnetization with respect to the reference layer magnetization, with the magnetization of the sensor layer being saturated by way of an external saturation field in a direction at right angles to the reference layer magnetization, after which the magnetic field is then switched off or reduced to such an extent that the magnetization of the sensor layer passes through a critical point as it comes out of saturation, at which critical point the rotation direction of the sensor layer magnetization can be influenced via an existing local magnetic field that is to be measured.

Firstly, in the method according to at least one embodiment of the invention, a magnetoresistive sensor element is used, comprising a hard-magnetic reference layer, whose magnetization is fixed in one pronounced direction, as well as a soft-magnetic sensor layer whose magnetization can be rotated by way of an external field. The resistance across this layer sequence depends on the position of the two magnetizations relative to one another. If the two layer magnetizations are in the parallel position, the resistance is small, but is large if they are in the antiparallel position. The element resistance thus changes in a corresponding manner as a function of the magnetization position, which means that, when a voltage is applied to the magnetoresistive structure, a signal which unambiguously defines the respective state can be tapped off as a function of this.

One advantageous feature of at least one embodiment of the invention is that the process of field production for magnetization of the magnetoresistive element is decoupled from that of the actual stray-field detection. According to at least one embodiment of the invention, the soft-magnetic sensor layer is saturated by the application of an external saturation magnetic field, to be precise in a direction at right angles to the reference layer magnetization. Thus, the saturation magnetic field at the location of the sensor layer has a field component which rotates the soft-magnetic layer magnetization to a direction at right angles to the reference layer magnetization. This direction is at the same time chosen such that it represents the heavy direction of magnetic anisotropy. The saturation magnetic field strength is chosen to be sufficiently strong that the sensor layer enters saturation in all cases. The saturation magnetic field is then reduced or completely switched off, which leads to the sensor layer magnetization being rotated, coming from saturation, to an energetically better state. Owing to the magnetic anisotropy, this is the parallel or antiparallel position with respect to the reference layer magnetization. A so-called critical point is passed through during this process, at which the saturated state is in thermodynamic equilibrium with two other states, specifically those with a direction component in each case one of the two light directions, that is to say parallel or antiparallel to the reference layer magnetization. This critical point, or unstable point, is also referred to as the triple point.

In this state, a very small field-strength variation is sufficient to produce the critical moment for rotation of the sensor layer magnetization to the parallel or antiparallel position. The resultant sensor signal which can be tapped off is thus also critically dependant on whether any such local field-strength variation does or does not exist.

This phenomenon is now made use of in the method according to at least one embodiment of the invention by magnetizing a magnetoresistive sensor element, for example a magnetoresistive TMR cell, in such a way that it passes through a critical point. The magnetization state and thus the resistance value across the sensor element at this point can be critically influenced by very small magnetic disturbances. If this disturbance is caused by a local stray field, for example of a magnetic bead, the final state, that is to say the resultant resistance value and hence the sensor signal which can be tapped off, is in consequence critically dependent on the presence of a particle such as this.

A sensor which is designed appropriately and is operated using the procedure according to at least one embodiment of the invention is in consequence many times more sensitive than a static sensor of flat design.

According to at least one embodiment of the invention, structures are used as the magnetoresistive element which, for example because of their shape anisotropy, allow only one magnetization state, that is to say they are preferably in the form of single-domain elements in the form of small ellipses or long, narrow strips. The final state, that is to say the setting of the layer magnetization to one direction or the other and, associated with this, to one resistance effect or the other, is in consequence critically dependent on the states and the field distribution at the critical point, and can in consequence be used as a measure for these states or this field distribution.

The saturation magnetic field may be applied and reduced or switched off at any desired frequencies, which may be more than 1 kHz, thus carrying out as many measurement cycles as possible per unit time. A plurality of measurement cycles are normally carried out successively and the respective state which occurs in this case, and/or the sensor signal which occurs in this state, are/is recorded, in which case, on average, a quasi-stable sensor signal can be tapped off, depending on the average resultant final position of the sensor layer magnetization once it has been rotated back from saturation. However, if a magnetic bead has been bound, the field component which results from the magnetic bead results in a preferred rotation direction at the critical point, so that, on average the sensor signal to be tapped off necessarily changes, and the presence of a magnetic bead can be clearly detected.

The sensor layer itself can preferably be saturated within one measurement cycle by variation of the saturation magnetic field alternately in both possible directions at right angles to the reference layer magnetization, that is to say the saturation magnetic field is varied such that the entire hysteresis curve of the soft-magnetic sensor layer is passed through into the respective saturation region. Two critical points are thus passed through during one cycle, specifically with the sensor layer magnetization being saturated in one direction and in the opposite direction during one cycle.

According to at least one embodiment of the invention, it is also advantageous if an external stabilization magnetic field, which is at right angles to the plane of the reference layer and sensor layer magnetization, is produced in order to fix the position of a moving part, in particular of the magnetic bead, which produces the very small local magnetic field that is to be measured. By way of example, this stabilization magnetic field is used to force the magnetic bead into a preferred position with respect to the magnetoresistive sensor element. Once this stabilization magnetic field is at right angles to the reference and sensor layer magnetization, that is to say it also has no field component which lies on the plane of the layer and would thus exert a rotation impulse on the sensor layer magnetization, the stabilization magnetic field does not influence the sensor signal. The magnetoresistive element is therefore not sensitive to the stabilization magnetic field. Nevertheless, this stabilization magnetic field forces the magnetic bead into a predetermined position, in which the stray-field magnetization of the bead is optimally positioned with its magnetization component, which lies on the same plane as the sensor layer magnetization and thus causes it to be rotated.

It is also advantageous if at least one sensor bridge is used, including four magnetoresistive elements connected in a bridge circuit, for magnetic field measurement. In this case, the presence, of example, of a magnetic bead can be detected by detuning the sensor bridge.

By way of example, an AMR (anisotropic magnetoresistive) element, a GMR (giant magnetoresistive) element or a TMR (tunnel magnetoresistive) element can be used as a magnetoresistive element, which is either used as a separate measurement element or is integrated in a bridge circuit, forming a sensor bridge.

In the case of the device according to at least one embodiment of the invention for carrying out the method, at least one magnetoresistive element, comprising a hard-magnetic reference layer and a soft-magnetic sensor layer, whose magnetization can be rotated to a parallel position or an antiparallel position with respect to the reference layer magnetization, and whose output signal which can be tapped off is dependent on the position of the sensor layer magnetization with respect to the reference layer magnetization, and at least one interconnect is provided, which is or can be coupled to a power supply and is guided adjacent to the magnetoresistive element in such a manner that, with a varying current flow, a saturation magnetic field can be produced in a varying manner by way of it, which saturation magnetic field is at right angles to the reference layer magnetization and saturates the sensor layer magnetization.

It is essential for the interconnect to be arranged in such a manner that a saturation magnetic field can be produced which is at right angles to the reference layer magnetization but also acts only locally in this area, in order not to influence any adjacent devices or elements.

At least one sensor bridge is preferably provided, including four elements connected in the form of a bridge circuit which is associated with one common interconnect or possibly with a plurality of interconnects through which, however, current then flows jointly and homogenously. The one or more interconnects are preferably arranged such that each of them runs or run below the magnetoresistive element or elements.

Furthermore, at least one further interconnect can be provided, which runs at right angles to the at least one first interconnect and is or can be coupled to a current source, and is arranged in such a manner that, with a current flow, a stabilization magnetic field can be produced by it in order to fix the position of a moving part, in particular of a bead, which produces the very small local magnetic field to be measured, which stabilization magnetic field is at right angles to the plane of the reference and sensor layer magnetization. Two further interconnects are preferably provided, which run parallel and between which the magnetoresistive sensor element or elements is or are arranged, so that two homogenous, mutually complementary, stabilization magnetic fields can be produced, and an overall stabilization field can be produced which is symmetrical with respect to the magnetoresistive element or elements.

The device preferably has a plurality of magnetoresistive elements or sensor bridges which are arranged distributed over an area in the form of an array, with each element or each sensor bridge producing a separate output signal.

The device, which is preferably in the form of a chip or is provided on a chip, thus represents a flat sensor which allows the detection of any locally existing and fixed magnetic beads, or their stray fields, on a locally resolved basis by virtue of the array arrangement of the magnetoresistive elements or the sensor bridges. From a production point of view, it is expedient for the device to be in form of a chip or to be arranged on a chip, and in particular the device can be coupled without any problems to a third object which contains, for example, a liquid which is to be investigated and contains magnetic beads. In particular, a third object such as this is in the form of a cartridge for DNA or protein analysis, with the cartridge preferably being the same size as a check card. A cartridge such as this is, for example, described in principle in German patent application DE 10 2004 021 822, which was not published prior to this, with the device according to at least one embodiment of the invention, on the cartridge side, being arranged at a point where it is possible to detect locally fixed magnetic beads, which may be locally fixed via the initially described, locally fixed DNA catcher molecules.

BRIEF DESCRIPTION OF THE DRAWINGS

Further advantages, features and details of the invention will become evident from the description of figures of example embodiments, as described in the following text, and from the drawings, in conjunction with the patent claims.

In the figures.

DETAILED DESCRIPTION OF THE EXAMPLE EMBODIMENTS

Figure 1:
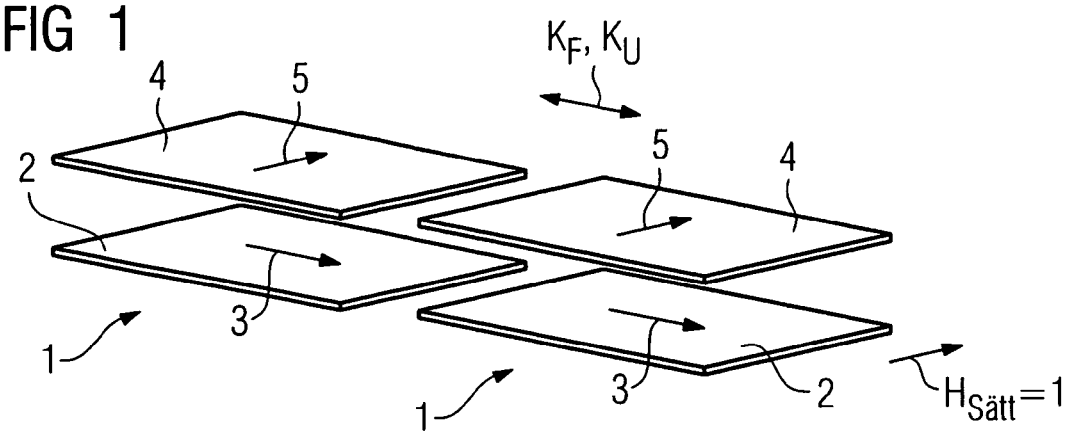
FIG. 1 shows an outline illustration of two magnetoresistive elements with a saturation field applied.

FIG. 1 uses an outline illustration to show two magnetoresistive elements 1, each comprising a reference layer 2 with a hard reference layer magnetization 3, as well as a soft-magnetic sensor layer 4 whose magnetization 5 can be rotated relative to the reference layer magnetization 3 by way of an external field. The further layers which are normally provided are not shown, for clarity reasons.

The two magnetoresistive elements 1, 2 in FIG. 1 form a typical pair of spin valves and are shown in the state in which the soft-magnetic magnetization 5 is saturated along the heavy direction, that is to say at right angles to the reference layer magnetization 3. An external saturation magnetic field $H_{satt}$ is applied for this purpose, is aligned at right angles to the reference layer magnetization 3 and rotates the soft-magnetic layer magnetization 5, which can be rotated, likewise to a position at right angles. The electrical resistance of this structure, which results from the layer stack, is in this case in a medium range. The total absolute magnitude of the resistance is governed by the relative position of the layer magnetization 5 with respect to the reference layer magnetization 3.

Figure 2:
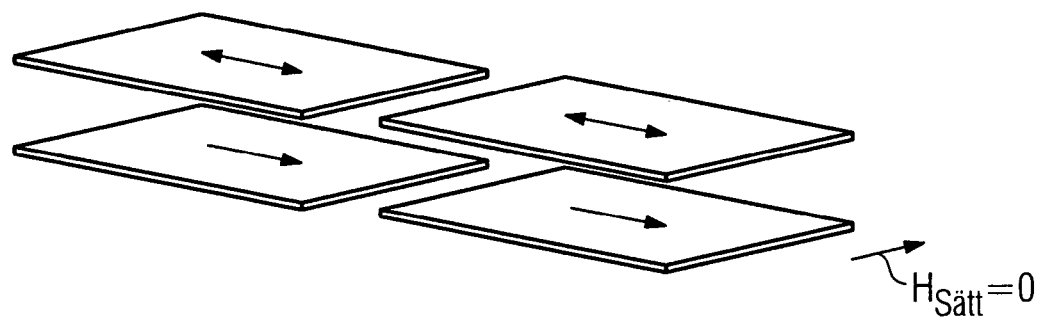
FIG. 2 shows an illustration corresponding to FIG. 1, with the saturation field switched off.

If the external saturation field is now switched off, as is illustrated in FIG. 2, with $H_{satt}=0$, then the layer magnetizations 5 are rotated back to the light direction, assisted by the shape anisotropy $K_F$ as well as the uniaxial anisotropy $K_u$. The light axis is then collinear with the reference layer magnetization.

Two equally justified final states can then occur, specifically a final state in which the soft-magnetic layer magnetization 5 is parallel to the reference layer magnetization. The resistance across this layer structure would be low. The second equally justified state results with the soft-magnetic layer magnetization being in the antiparallel position with respect to the reference layer magnetization, in which case the element resistance is high.

The state which is generally adopted during the backward rotation with the saturation field switched off is now dependent on local field components. Firstly the Néel coupling (which leads to parallel alignment) between the measurement layer and the reference layer and secondly the stray-field coupling (which leads to an antiparallel alignment) between the measurement layer and the reference layer can act on local field contributions. However, both of these contributions are approximately the same in the two elements, to that their contribution can be ignored. However, if other local field differences occur, for example as a result of a magnetic bead, then their effect in the two elements will not be the same.

The design of a magnetoresistive element, irrespective of whether this is an AMR, a GMR or a TMR element, is known from the prior art and therefore requires no further explanation. The elements shown in all of the figures represent only outline illustrations, which are intended to illustrate only the fundamental principle of operation.

Figure 3:
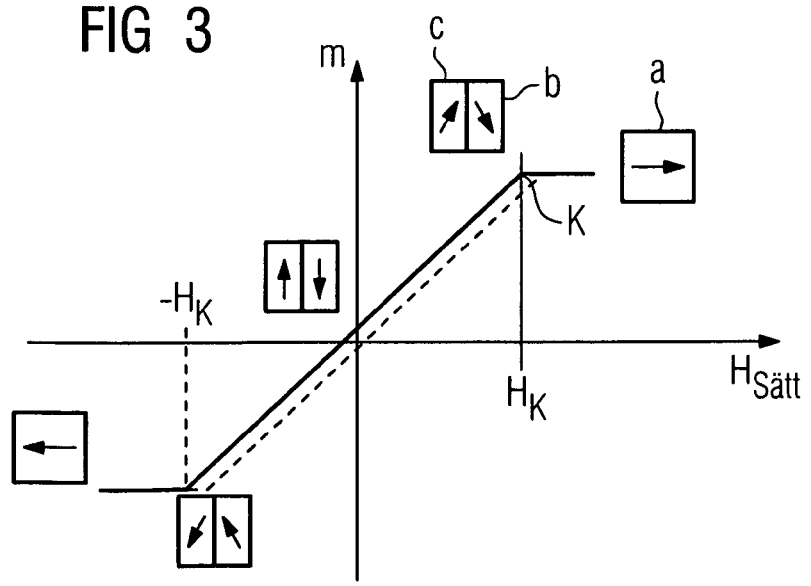
FIG. 3 shows a diagram to illustrate a typical magnetization curve of the soft-magnetic layer of a magnetoresistive element, showing the critical points.

The processes as illustrated in FIGS. 1 and 2 will be described once again with reference to FIG. 3 and the typical magnetization curve m(H) shown there of a single-axis material along the heavy direction. Structures which allow only a single magnetization state are preferably used for the magnetoresistive elements to be used according to an embodiment of the invention, in which case this single magnetization state can be provided primarily by the corresponding shape, and the shape anisotropy resulting from this. These are single-domain elements in the form of small ellipses or long strips. FIG. 3 shows the external saturation field $H_{satt}$ on the abscissa, and the magnetization m(H) on the ordinate, in each case with respect to the magnetization of the soft-magnetic layer 4 in the embodiment shown in FIG. 1.

Starting from a saturation field $H_{satt}$=0, the external saturation field is applied, thus resulting in the magnetization along, for example, the extended magnetization or hysteresis curve, and this is rotated for example from its position parallel to the reference layer magnetization. On meeting the anisotropy field $H_k$, the soft-magnetic layer 4 enters the saturation region, that is to say it is aligned at right angles to the reference layer magnetization, and thus parallel to the saturation field $H_{satt}$. Any further increase in the saturation field strength no longer results in any change in the magnetization alignment.

If the saturation field is now switched off, then the magnetization passes through a critical point on reaching the anisotropy field $H_k$. The saturated state occurs precisely at this critical point or in this field in thermodynamic equilibrium, with two other states, specifically the states with in each case one component and in each case one of the two light directions respectively parallel to and antiparallel to the reference layer magnetization, that is to say this is an unstable magnetization state.

The mutually equivalent states or phases at the critical point are illustrated at a, b and c in FIG. 3. In the end, as described above, the intrinsic coupling-dependent phenomena, specifically the so-called Néel coupling and the stray-field coupling, now govern which of the states b or c is assumed when the field is decreased further. A corresponding situation also occurs when the saturation magnetic field becomes negative, that is to say it is applied in the opposite direction, with the current flowing via an interconnect that produces this field, in the opposite direction. The soft-magnetic layer magnetization 5 would become saturated in the opposite direction, based on FIG. 1. In this case as well, as illustrated by the hysteresis curve shown in FIG. 3, the unstable critical point occurs in the anisotropy field $-H_k$ with the three magnetization states in equilibrium. Any further field reduction leads to the soft-magnetic layer magnetization 5 also rotating back in this case to the energetically preferred parallel or antiparallel position with respect to the reference layer magnetization 3.

Figure 4:
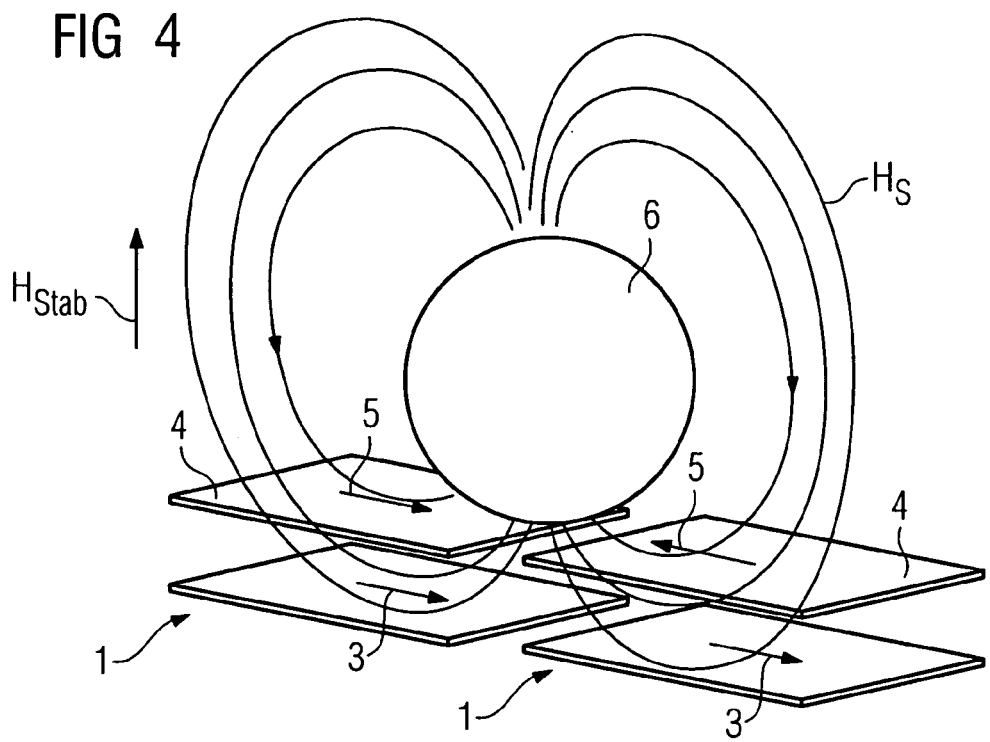
FIG. 4 shows an outline illustration of the states in the presence of a magnetic particle (magnetic bead)

The instability of the magnetization states at a critical or unstable point such as this is now used to detect very small local magnetic fields. By way of example, FIG. 4 shows the two elements 1 from FIGS. 1 and 2, above which a magnetic particle in the form of a magnetic bead 6 is located. The magnetic bead 6 produces a stray field $H_s$, which can be detected. For this purpose, the magnetic bead 6 is fixed in a specific position with respect to the elements 1 by way of an external stabilization field $H_{stab}$, which is at right angles to the reference and sensor layer planes. The stray field $H_s$ of the magnetic bead 6 has a horizontal field component, as can be seen, in the plane of the sensor layer 4, and this horizontal field component can cause rotation of the layer magnetization 5.

If the saturation magnetic field $H_{satt}$ is now switched off after previous saturation, then the layer magnetization 5 of each soft-magnetic sensor layer 4 is additionally at right angles to the reference layer magnetization 3. As the external field decays, the critical point K is reached on the magnetization curve shown in FIG. 3, that is to say the critical or unstable state occurs. In this state, the magnetic field component (even though it is extremely small) of the stray field $H_s$ of the magnetic bead 6 is sufficient to give the layer magnetization 5 of each sensor layer 4 a small, but sufficient, rotation impulse, so that the respective layer magnetization is rotated back to a specific position with respect to the reference layer magnetization. While, for example where no magnetic bead 6 is present, the two layer magnetizations 5 each end up parallel to the reference layer magnetization, starting from saturation, the stray field $H_s$ caused by the presence of a magnetic field 6 results, as shown in FIG. 4, in a different, asymmetric state.

In FIG. 4, the layer magnetization 5 of the left-hand magnetoresistive element 1 is parallel to the reference layer magnetization 3, while, because of the stray-field impulse and the in-plane component of the stray field $H_s$, the layer magnetization 5 of the right-hand element 1 is antiparallel to the reference layer magnetization. The resistances of the two elements 1 are in consequence different, that is to say this difference can also be used to clearly determine that there is a field inhomogeneity, that is to say a magnetic bead, which actively influences the positioning of the magnetic relationships without a saturation field, at the measurement location.

Figure 5:
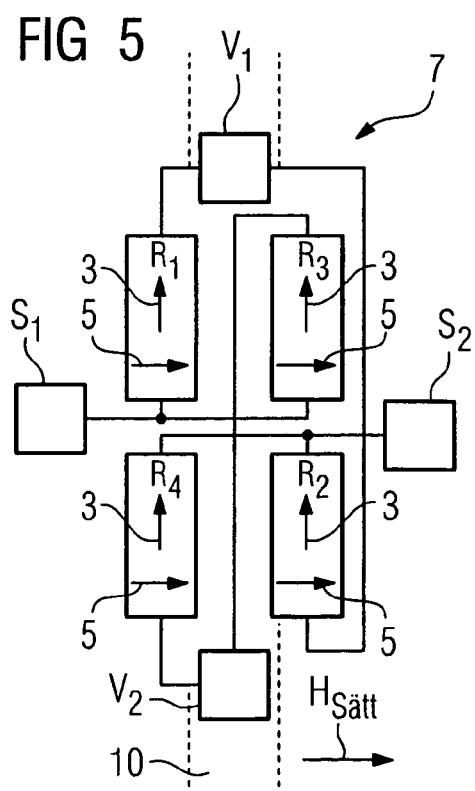
FIG. 5 shows an outline illustration of a sensor bridge using four magnetoresistive elements that are saturated.
Figure 6:
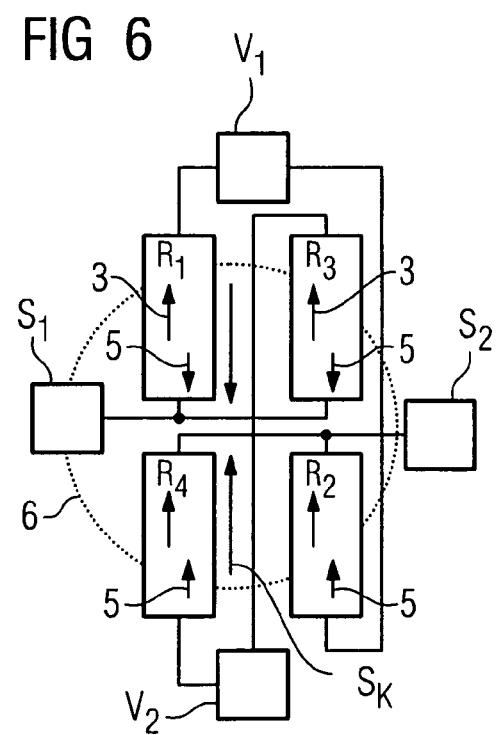
FIG. 6 shows the sensor bridge from FIG. 5 in the presence of a magnetic particle (magnetic bead) after the saturation field has been switched off.

In theory, just a single magnetoresistive element, whose magnetization behavior is varied appropriately by way of the saturation field, is sufficient to detect a magnetic bead such as this. However, a refinement of the sensor device in the form of a bridge is also equally possible. FIGS. 5 and 6 show one such bridge 7. The presence of a magnetic bead can be read by detuning the sensor bridge as a function of the stray field.

Four magnetoresistive elements, which are annotated $R_1$, $R_2$, $R_3$ and $R_4$, are connected to form a bridge in the bridge 7. A supply voltage $V_{1,2}$ is applied to the bridge, with the output signal which can be tapped off at the taps $S_1$, $S_2$ being 0 while the resistances of all of the magnetoresistive bridge elements $R_{1-4}$ are identical, that is to say when the respective position of the respective sensor layer magnetization 5 with respect to the respective reference layer magnetization 3 is also the same. If the resistances of the elements $R_1$, $R_3$ now each change in an opposite and mirror-image form with respect to those of the elements $R_2$, $R_4$, then this results in the maximum detuning of the bridge 7, that is to say the greatest possible signal, $S_{1,2}$ can be tapped off.

FIG. 5 shows the state when a saturation field $H_{satt}$ is applied. The layer magnetizations 5 of all the elements $R_{1-4}$ are at right angles to the respectively parallel-aligned reference layer magnetizations 3 of all of the elements.

If the saturation field $H_{satt}$ is now switched off, and a magnetic bead 6 is located above the sensor bridge or in its measurement area, as is illustrated by the dotted line in FIG. 6, then a bead stray-field component is produced at the location of the respective elements $R_{1-4}$, along the respective light axis of the soft-magnetic layers 4 of all of the elements. This bead stray-field component is illustrated by the arrows $S_k$ in FIG. 6 and, at the critical point K, results in the layer magnetization 5, which in each case has the stray-field component applied to it, being produced in this predetermined direction. As can be seen, the layer magnetizations 5 of the elements $R_1$, $R_3$ are antiparallel to the reference layer magnetization 3, while the layer magnetization 5 of the elements $R_2$, $R_4$ is parallel to the respective reference layer magnetization 3. When remanence is present, this therefore results in a change in the resistance across the entire bridge, thus resulting in a change in the signal $S_{1,2}$ that is tapped off.

In FIG. 6, the bridge is thus detuned solely by the in-plane component of the bead stray field $H_s$ at the respective location of the bridge elements. If no magnetic bead were present, the distribution would be purely random, and on average the bridge would be in equilibrium. If the idealized assumption is now made that the corresponding coupling effects are identical in all the bridge elements, the same resistances should always occur in a remanence situation in the ideal case with each cyclic run through the hysteresis curve shown in FIG. 3. However, clear detuning occurs when, as described, a magnetic bead is located in the measurement area, since the equilibrium of the bridge is then necessarily disturbed.

Figure 7:
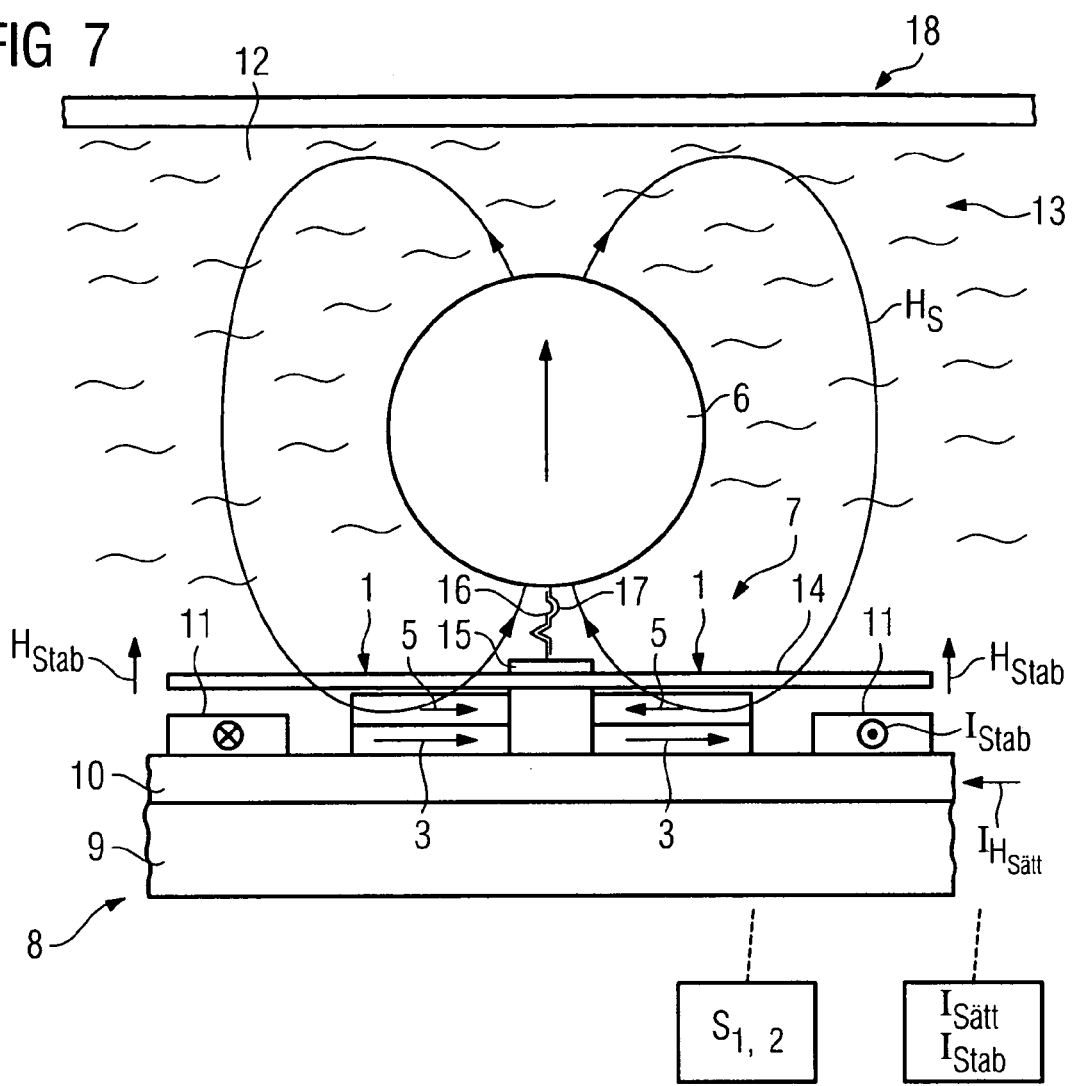
FIG. 7 shows an outline sketch of a device according to an embodiment of the invention, coupled to a cartridge, containing magnetic beads.

FIG. 7 shows an outline illustration of a device 8 according to an embodiment of the invention which is in the form of a sensor device, preferably a chip, which can be used as a separate component on or in a cartridge 18 that is used for DNA analysis. The described magnetic beads can be used for such DNA analysis purposes and in this context are used to bind unlocked DNA strings which occur after the cells have been unlocked. In this case, only a detail of the chip-like device 8 is illustrated, and it preferably has a larger sensor area. This is only an outline illustration in which only the functional components are shown, and in which any isolating layers between interconnects, etc, are not shown in any more detail, for the sake of clarity.

The chip-like device 8 has a mount 9 on which a first interconnect 10 is applied in the illustrated example. This interconnect 10 runs, for example underneath and symmetrically with respect to a sensor bridge 7, as is illustrated by dashed lines in FIG. 5. The sensor bridge 7 is located above the interconnect 10 and of course electrically isolated from it, although only two elements 1 of this sensor bridge are illustrated here. By way of example, these are the elements $R_1$, and $R_3$ from FIG. 5. FIG. 7 shows two further interconnects 11 adjacent to the elements, running at right angles to the interconnect 10 and likewise isolated from it, of course, with these representing a conductor loop which is passed around the sensor bridge 7. This interconnect is used to produce a stabilization magnetic field $H_{stab}$, which is used for alignment of a magnetic bead.

The chip-like device 8 in the example shown in FIG. 7—as already described above—is arranged on a cartridge 18 in which a space 12 is provided in which a suspension 13 containing a large number of individual magnetic beads 6 is present. The device 8 is separated from this space 12 by a membrane-like separating wall 14. A holder 15, for example a "gold pad", to which a DNA catcher molecule 16 (which has a characteristic nucleic acid sequence) is fixed is located on the inner face of this wall 14. This is indicated by the corresponding shape in FIG. 7.

If a magnetic bead to which a DNA string 17 is bound which has the same nucleic acid sequence, is now located in the suspension 13, then the DNA string 17 is attached to the DNA catcher molecule 16, as is illustrated in FIG. 7. This results in the magnetic bead 6 being locally fixed above the sensor bridge 7. As described, this produces a stray field $H_s$, which acts on the soft-magnetic layer magnetizations 5.

In order to saturate the layer magnetizations 5, a saturation current $I_{Hsatt}$ is now first of all passed via the conductor 10, resulting in the production of the saturation magnetic field $H_{satt}$ which rotates the magnetizations 3 at right angles to the reference layer magnetizations 3. At the same time, a stabilization current $I_{stab}$ is applied to the interconnect or to the conductor loop 11, so that, as a consequence of this, a magnetic stabilization field $H_{stab}$ is produced which has only a vertical component (that is to say a field component which is located vertically on the sensor layer plane 4) in the area of the soft-magnetic layers 4.

The stabilization field $H_{stab}$ forces the magnetic bead 6 into a specific position with respect to the sensor bridge 7, once the conductor loop 11 has been passed symmetrically with respect to the sensor bridge 7 and the sensor bridge 7 is once again symmetrical with respect to the holder 15. The magnetic bead 6 is thus held in a defined alignment with respect to the sensor bridge 7, so that the stray field $H_s$ acts symmetrically on all of the bridge elements.

When the saturation field $H_{satt}$ is switched off, this results as stated in the critical state K, in which the effect of the respective in-plane component of the bead stray field $H_s$ affects the position of the magnetization direction of the layer magnetizations 5. As can be seen, in the case of the left-hand element 1, these are positioned parallel, while in the case of the right-hand element 1, they are positioned antiparallel with respect to the respective reference layer magnetization 3. This results in the change in resistance, as described above, across the sensor bridge 7.

Figure 8:
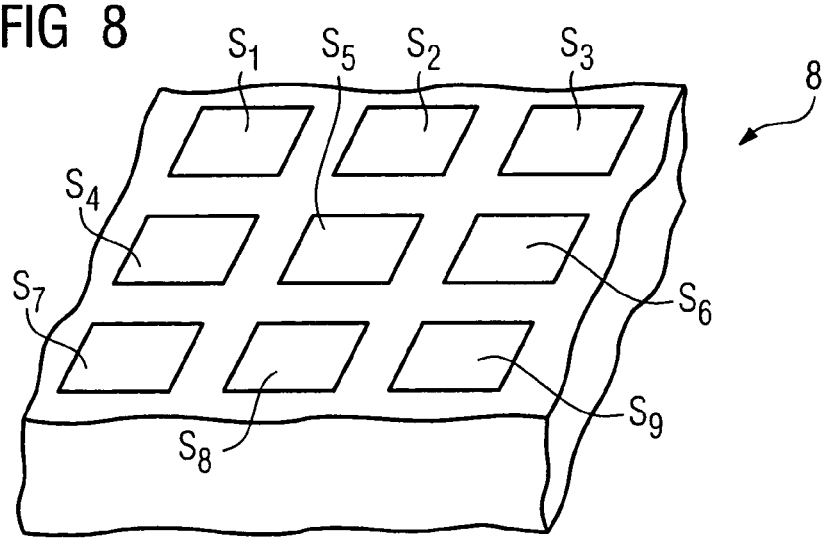
FIG. 8 shows an outline illustration of a sensor bridge array of a device according to an embodiment of the invention, in the form of a chip.

Finally, FIG. 8 shows the device 8 from FIG. 7 illustrated enlarged, with only a detail likewise being illustrated in this case. By way of example, the illustration shows seven sensors $S_1$ to $S_9$, which are arranged distributed over the sensor area in the form of an array. Each sensor $S_1$ to $S_9$ comprises, for example a sensor bridge 7 in addition to the required interconnects 10 and 11, in order to produce the respective saturation field as well as the stabilization field. The interconnects 10, 11 are advantageously routed such that current can be passed via all of them, via a common supply connection.

Alternatively, of course, it is also possible to provide a plurality of such connections. The local arrangement of the individual sensors $S_1$-$S_9$ is in the end governed by the arrangement of the holders 15 as well as the catcher molecules 16 on the cartridge 18, to which the device 8 can be connected for measurement purposes.

In a chip which is used in practice to carry out a DNA analysis on the basis of the method according to at least one embodiment of the invention, a considerably greater number of sensors such as these are, of course, distributed over the sensor area.

What is claimed is:

1. A method for measurement of very small local magnetic fields, comprising:

using at least one magnetoresistive element, the at least one magnetoresistive element including a hard-magnetic reference layer and a soft-magnetic sensor layer, a magnetization of the soft-magnetic sensor layer configured to be rotated to a position that is parallel or antiparallel with respect to a magnetization of the hard-magnetic reference layer, wherein a plurality of signals tapped off from the magnetoresistive element are dependent on a position of the magnetization of the sensor layer with respect to a position of the magnetization of the reference layer when the magnetization of the sensor layer is saturated in a direction at a right angle to the magnetization of the reference layer using an external saturation magnetic field;

at least one of switching off and reducing, by an external power supply, the external saturation magnetic field such that the magnetization of the sensor layer passes a critical point as the sensor layer comes out of saturation, wherein the critical point is an unstable magnetization state of the sensor layer in which the magnetization of the sensor layer is saturated and the saturated magnetization state of the sensor layer is in thermodynamic equilibrium with at least two other magnetization states of the sensor layer,
a direction of rotation of the magnetization of the sensor layer at the critical point is influenced by a local magnetic field, the local magnetic field being one of the very small local magnetic fields that are measured, and
the magnetization of the sensor layer attains one of the at least two other magnetization states of the critical point due to the influence of the local magnetic field resulting in a change in a signal tapped off at the critical point, the signal being from the plurality of signals; and
recording and evaluating only the signal tapped off at the critical point.

2. The method as claimed in claim 1, further comprising: applying the external saturation magnetic field at a frequency of more than 1 Hz and at least one of reducing and switching off the applied external magnetic field.

3. The method as claimed in claim 2, further comprising: saturating the sensor layer within one measurement cycle by changing the saturation magnetic field alternately in the two possible directions perpendicular with respect to the magnetization of the reference layer.

4. The method as claimed in claim 1, further comprising: producing an external stabilization magnetic field to fix a position of a bead, wherein the external stabilization magnetic field is at right angles to a plane of the reference and sensor layer magnetization, and wherein the bead produces the measured very small local magnetic field.

5. The method as claimed in claim 1, further comprising: using at least one sensor bridge, the sensor bridge including four magnetoresistive elements connected in a bridge circuit.

6. The method as claimed in one claim 1, further comprising:
using at least one of an AMR (anisotropic magnetoresistive) element, a GMR (giant magnetoresistive) element and a TMR (tunnel magnetoresistive) element as the at least one magnetoresistive element.

7. A device that measures very small local magnetic fields, the device comprising:
at least one magnetoresistive element including a hard-magnetic reference layer and a soft-magnetic sensor layer, wherein
a magnetization of the soft-magnetic sensor layer is configured to rotate to a position parallel or antiparallel with respect to a magnetization of the hard-magnetic reference layer, and
the at least one magnetoresistive element is configured to output a plurality of signals dependent on the position of the magnetization of the sensor layer with respect to the magnetization of the reference layer; and
at least one interconnect adjacent to the at least one magnetoresistive element and configured to couple to an external power supply, wherein
a varying current flowing through the at least one interconnect produces a varying saturation magnetic field, the varying saturation magnetic field being at right angles to the magnetization of the reference layer and saturating the magnetization of the sensor layer,
switching off or reducing the varying saturation magnetic field causes the magnetization of the sensor layer to pass a critical point as the magnetization of the sensor layer comes out of saturation, the critical point being an unstable magnetization state of the sensor layer in which the magnetization of the sensor layer is saturated and the saturated magnetization state of the sensor layer is in thermodynamic equilibrium with at least two other magnetization states of the sensor layer,
the magnetization of the sensor layer attains one of the at least two other magnetization states of the critical point due to an influence of a local magnetic field resulting in a change in a signal tapped off at the critical point, the signal being from the plurality of signals, and
only the signal tapped off at the critical point is recorded and evaluated.

8. The device as claimed in claim 7, further comprising:
at least one sensor bridge including four magnetoresistive elements which are connected in a bridge circuit, the magnetoresistive elements being associated with at least one of a common interconnect and a plurality of interconnects.

9. The device as claimed in claim 7, wherein the at least one interconnect runs below the at least one magnetoresistive element.

10. The device as claimed in claim 7, further comprising:
at least one additional interconnect,
wherein the at least one additional interconnect runs at right angles to the at least one interconnect and is coupled to a current source, and
wherein the at least one additional interconnect is arranged such that, with a current flow, the at least one additional interconnect produces a stabilization magnetic field to fix a position of a moving part which produces the very small local magnetic fields that are measured, the stabilization magnetic field being at right angles to a plane of the magnetization of the reference and sensor layers.

11. The device as claimed in claim 10, further comprising:
two additional interconnects which run in parallel and between which the at least one magnetoresistive element is arranged.

12. The device as claimed in claim 7, further comprising:
at least one of a plurality of magnetoresistive elements and sensor bridges arranged distributed over an area in a form of an array, each magnetoresistive element or sensor bridge producing a separate output signal.

13. The device as claimed in one of claim 7, wherein the device is at least one of a chip and arranged on a chip.

14. The device as claimed in claim 7, wherein the device is configured to be at least one of arranged on, arranged in, fitted to and fitted in a cartridge for at least one of DNA analysis and protein analysis.

15. The method as claimed in claim 1, wherein the external saturation magnetic field is applied at a frequency of more than 1 kHz and is at least one of reduced and switched off.

16. The device as claimed in claim 8, wherein the at least one interconnect runs below the at least one magnetoresistive element.

* * * * *

UNITED STATES PATENT AND TRADEMARK OFFICE
CERTIFICATE OF CORRECTION

| | | |
|---|---|---|
| PATENT NO. | : 8,283,184 B2 | Page 1 of 1 |
| APPLICATION NO. | : 11/523535 | |
| DATED | : October 9, 2012 | |
| INVENTOR(S) | : Ruhrig | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1315 days.

Signed and Sealed this
Ninth Day of September, 2014

Michelle K. Lee
*Deputy Director of the United States Patent and Trademark Office*